United States Patent [19]
Kato et al.

[11] Patent Number: 5,432,357
[45] Date of Patent: Jul. 11, 1995

[54] DIAMOND FILM ELECTRONIC DEVICES

[75] Inventors: Rie Kato; Koji Kobashi, both of Kobe, Japan

[73] Assignee: Kabushiki Kaisha Kobe Seiko Sho, Kobe, Japan

[21] Appl. No.: 280,135

[22] Filed: Jul. 25, 1994

Related U.S. Application Data

[63] Continuation of Ser. No. 46,803, Apr. 16, 1993, abandoned.

[30] Foreign Application Priority Data

Apr. 16, 1992 [JP] Japan .................. 4-096501

[51] Int. Cl.$^6$ .............................. H01L 49/00
[52] U.S. Cl. ........................ 257/77; 257/76; 338/22 R
[58] Field of Search ............... 257/76, 77; 338/22

[56] References Cited

U.S. PATENT DOCUMENTS

| | | | |
|---|---|---|---|
| 3,986,196 | 10/1976 | Decker et al. | |
| 4,359,372 | 11/1982 | Nagai et al. | 204/192 |
| 5,066,938 | 11/1991 | Kobashi et al. | 338/22 SD |
| 5,081,438 | 1/1992 | Nakahata et al. | 338/225 |
| 5,099,296 | 3/1992 | Mort et al. | 257/77 |
| 5,254,862 | 10/1993 | Kalyankjumar et al. | 257/77 |
| 5,287,003 | 2/1994 | Van Andel et al. | 257/787 |

FOREIGN PATENT DOCUMENTS

| | | | |
|---|---|---|---|
| 0262601 | 4/1988 | European Pat. Off. | |
| 0392461 | 10/1990 | European Pat. Off. | |
| 0392467 | 10/1990 | European Pat. Off. | |
| 3132555 | 6/1982 | Germany | |
| 52-58491 | 5/1977 | Japan | 257/787 |
| 63-11335 | 7/1989 | Japan | 257/621 |
| 1185943 | 7/1989 | Japan | |
| 2290084 | 11/1990 | Japan | 257/77 |

*Primary Examiner*—Rolf Hille
*Assistant Examiner*—Valencia Martin Wallace
*Attorney, Agent, or Firm*—Oblon, Spivak, McClelland, Maier & Neustadt

[57] ABSTRACT

A pair of electrodes 3 are first formed on a substrate. Subsequently, an undoped diamond film is selectively deposited between the above electrodes. A B-doped diamond film is then selectively formed on both the insulating diamond film and part of each electrode. The substrate may be contained in a container provided with an opening portion from which only the B-doped diamond film is exposed.

19 Claims, 3 Drawing Sheets

DIAMOND FILM ELECTRONIC DEVICES

This application is a Continuation of application Ser. No. 08/046,803, filed on Apr. 16, 1993, now abandoned.

BACKGROUND OF THE INVENTION

1. Field of the Invention

The present invention relates to diamond film electronic devices using boron (B)-doped semiconducting diamond films, and its fabrication method.

2. Description of the Related Art

As a semiconducting material, diamond has a large band gap and an excellent stability against chemicals and radiation. Hence it is expected to be applicable for electronic devices used in harsh environments. In particular, thermistors using diamond films doped with boron (hereinafter, referred to as B-doped diamond films) are expected to be operated in a wide temperature range between room and high temperatures, and have a short response time and an excellent chemical resistance. Thus, attempts have been done to fabricate such thermistors (Fujimori, and others; NEW DIAMOND, vol 5, No. 2, p. 32, (1989), and Japanese Patent Laid-open No. Hei 3-83301).

FIG. 9 is a perspective view of a thermistor made by a prior art using B-doped diamond films. A B-doped diamond film 32 is formed on a substrate 31 made of $Si_3N_4$. A pair of electrodes 33 are formed on the diamond film 32. The electrode 33 consists of a bilayer of Ti/Au films, or a multi-layer of Ti/Mo/Au films. Also, a protective layer 34, made of $SiO_2$, is deposited between a pair of electrodes 33 in such a manner as to be slightly extended onto the electrodes 33. Furthermore, lead wires 35 made of Ni are attached to the areas of the electrodes 33, not covered with the protective layer 34, with Ag pastes 34.

The thermistor described above has a negative temperature coefficient, in which the resistance decreases with increasing temperature.

However, the above thermistors and other electronic device having similar structures have the following disadvantages: semiconducting diamond electronic devices are expected to be used at high temperatures and in other harsh environments. However, in the prior art of electronic devices using diamond films, the metal electrodes are exposed to air. Therefore, even though diamond films are not damaged in harsh environments, if electrode surfaces, electrode extraction portions, lead wires and the like are directly exposed to heat and external atmosphere, the electronic devices may be deteriorated.

To protect the electrode portions, the whole surface of the device may be covered with a protective layer, or the device may be enclosed in a protective container. However, if such methods are used for diamond film thermistors, for example, the temperature sensing part of the thermistor (i.e. B-doped diamond film) is separated from the environment and thus the thermal response time becomes extremely longer.

Furthermore, diamond film thermistors of the prior art have such a disadvantage that, in the mass-production, since only one set of the diamond film and electrodes is formed on each substrate, a large variation in the thermistor characteristics from one thermistor to another is unavoidable. Finally, since a set of the diamond film and electrodes is independently formed on each substrate, the productivity is low and hence the production cost is high.

SUMMARY OF THE INVENTION

It is therefore an object of the present invention to provide diamond film electronic devices with excellent thermal response, and stability against harsh environments. Thus, it is possible to reduce the device-to-device variation in their characteristics, and also to reduce the production cost.

A diamond film electronic device according to the present invention comprises a substrate; electrodes selectively formed on the substrate; and a boron-doped diamond film selectively formed on the substrate, covering at least part of each electrode.

A method for fabricating a diamond film electronic device according to the present invention comprises the steps of: forming a plurality of diamond film electronic devices on a single substrate, each of which consists of electrodes selectively formed on the substrate, and a boron-doped diamond film covering at least part of each of electrode; and cutting the substrate to separate a plurality of the diamond film electronic devices from each other.

In the diamond film electronic device according to the present invention, at least part of each electrode is covered with the boron-doped diamond film. The diamond film electronic device can be used, for instance, in such a manner as to be contained in a container with an opening where only the boron-doped diamond film is exposed, or the device is directly mounted in the wall surface of a vessel or a tube filled with gas or liquid whose temperature is to be measured. In this case, the electrodes are electrically connected to the measurement apparatus through holes provided on the portions not to be covered with the boron-doped diamond film or on the portions of the substrate corresponding to the electrode positions.

In these structures, since the electrodes are protected by the boron-doped diamond film to prevent from a direct exposure to the environment, it is possible to avoid the deterioration of the electrodes even if the environment is corrosive. Likewise, since neither electrode extraction portions nor the lead wires are exposed to the environment, the corrosion thereof can also be prevented. Furthermore, since the above boron-doped diamond film is directly in contact with the environment, the thermistor can maintain a short response time.

In order to protect the diamond film devices from very severe environmental conditions, one or multiple protective coating layers, such as $SiO_2$, $Si_3N_4$, BN or diamond, should be deposited on the diamond film.

In case that the boron-doped diamond film is directly deposited on the substrate, the crystallinity of the boron-doped diamond film near the substrate is generally poor, thereby the electric characteristics can also be poor. In order to avoid such inconvenience, it is preferable to first deposit an insulating diamond film on the substrate followed by the deposition of the boron-doped diamond film.

Also, according to the present invention, a plurality of diamond film electronic devices are concurrently formed on a single substrate, and then separated form each other by cutting the substrate. Generally, the characteristics of the thermistors depend on the doping concentration, the thickness of the boron-doped diamond film, and the size of the device. However, the present invention of concurrently fabricating a plurality of diamond film electronic devices can achieve a small variation in the device-to-device characteristics, reducing the production cost.

BRIEF DESCRIPTION OF THE DRAWINGS

The above and other objects, features and advantages of the present invention will become more apparent from the following description taken in connection with accompanying drawings, in which.

DETAILED DESCRIPTION OF THE PREFERRED EMBODIMENTS

Hereinafter, the preferred embodiment of the present invention will be described in detail with reference to the accompanying drawings.

EXAMPLE 1

Figure 1:
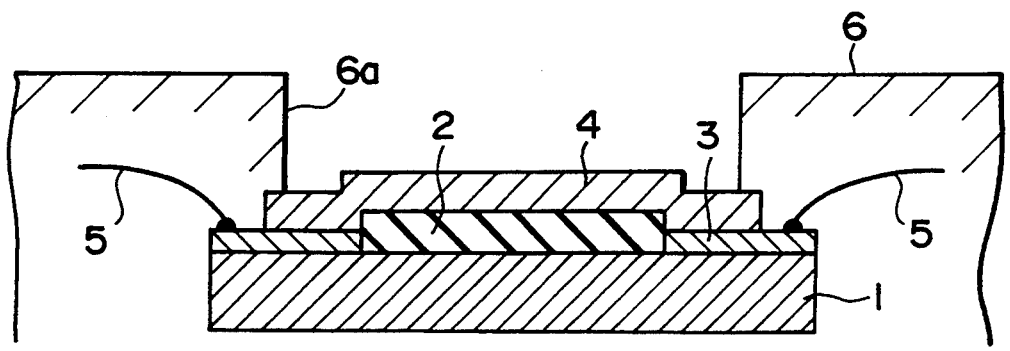
FIG. 1 is a cross sectional view showing a diamond film electronic device (thermistor) according to a first example of the present invention.

FIG. 1 is a cross sectional view showing a diamond film electronic device (thermistor) according to the first example of the present invention.

First, a pair of electrodes 3 are formed on the substrate 1. An undoped diamond film 2 (insulating diamond film) is then formed between the electrodes 3 in a specified pattern. A B-doped diamond film 4 is then formed on the undoped diamond film 2 in a manner to be extended onto the electrodes 3.

Lead wires 5 are wire bonded to the electrodes 3 at the portions not to be covered with the B-doped diamond film 4 to lead the signal to a measurement apparatus. A protective container 6 to contain the device has an opening portion 6a of a specified shape, from which only the B-doped diamond film 4 is exposed.

In this embodiment, since the electrodes 3 are partly covered with the B-doped diamond film 4, and also the remaining portions of the electrodes 3 and the lead wires 5 are contained in the protective container 6, it is possible to prevent the electrodes 3 and the lead wires 5 from being deteriorated by the corrosion due to the external environment. Also, since the opening portion 6a is provided on the container 6, the B-doped diamond film 4, which is the temperature sensing portion, is directly in contact with the external environment. Therefore, it is possible to maintain a high thermal response. Further, since the B-doped diamond film 4 is formed on the undoped diamond film 2, the crystallinity of the B-doped diamond film 4 is excellently good, thereby it is possible to achieve preferable characteristics of diamond devices (thermistors).

FIGS. 2 to 5 are cross sectional views showing a method for fabricating the diamond film thermistor described above in the order of process steps.

First, the insulating substrate 1 was subjected to a scarification treatment to increase the nucleation density of diamond in the diamond film formation process described later.

Figure 2:
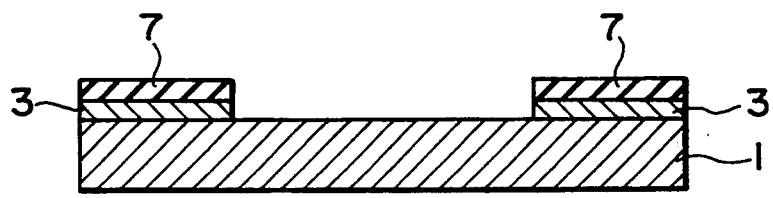
FIG. 2 is a cross sectional view showing the first step in the fabrication process of the diamond film electronic device.

As shown in FIG. 2, using standard methods of photolithography, Mo sputtering for metallic electrodes, $SiO_2$ sputtering, and a lift-off method, a pattern of $SiO_2$/Mo bilayer film was formed on the specified areas of the substrate surface. The $SiO_2$ film 7 was about 2000Å thick.

Figure 3:
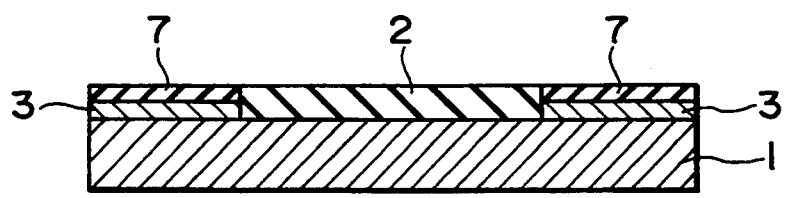
FIG. 3 is a cross sectional view showing the second step in the fabrication process of the diamond film electronic device.

As shown in FIG. 3, an undoped diamond was grown on the substrate 1, so that an undoped diamond film 2 was formed selectively between the electrodes 3 in a specified pattern. For the growth of the undoped diamond film, a microwave plasma chemical vapor deposition (CVD) apparatus was used. For the reaction gas, 0.5 volume % of $CH_4$ and 0.1 volume % of $O_2$ in hydrogen was used. During the film growth, the substrate temperatures was 800° C., the gas pressure was 35 Torr and the growth time was 7 hrs.

Figure 4:
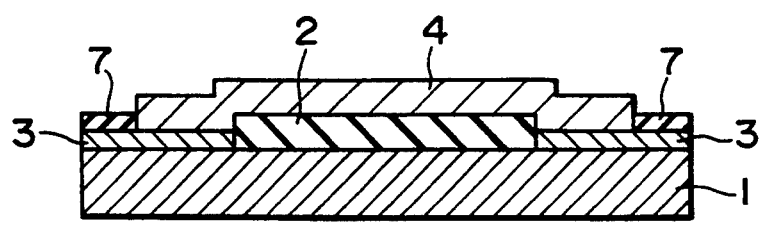
FIG. 4 is a cross sectional view showing the third step in the fabrication process of the diamond film electronic device.

Next, as shown in FIG. 4, part of the $SiO_2$ film 7 on each electrode 3 was removed by lithography, after which a B-doped diamond film 4 was selectively grown on both the undoped diamond film 2 and the electrodes 3 between the $SiO_2$ films 7. The B-doped diamond film 4 was formed using a reaction gas containing 0.5 volume % of $CH_4$ with 1 ppm of $B_2H_6$ in hydrogen. During the film growth, the substrate temperatures was 800° C., the gas pressure was 35 Torr and the growth time was 7 hrs.

Figure 5:
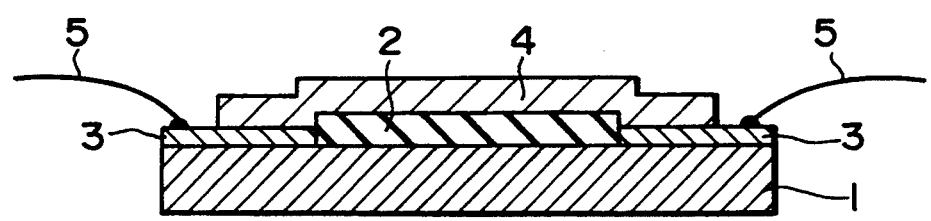
FIG. 5 is a cross sectional view showing the fourth process in the fabrication process of the diamond film electronic device.

As shown in FIG. 5, the $SiO_2$ films 7 were entirely removed, after which lead wires 5 were attached to the electrodes 3 at the portions not to be covered with the B-doped diamond film 4. Subsequently, as shown in FIG. 1, the substrate 1 was fixed in the protective container 6 in which only the B-doped diamond film 4 was exposed to the environment. Thus, the thermistor according to this example was accomplished.

In the fabrication method described above, a single thermistor is formed on a single substrate; however, a plurality of thermistors can be concurrently formed on a large substrate, and then separated from each other by cutting the substrate. This makes it possible to concurrently form a plurality of the thermistors with a small variation in the characteristics, and hence to reduce the production cost.

EXAMPLE 2

Figure 6:
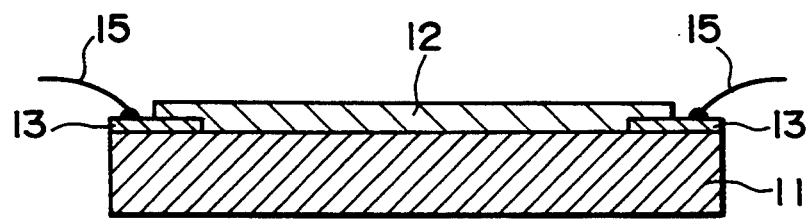
FIG. 6 is a cross sectional view showing a diamond film electronic device according to the second example of the present invention.

FIG. 6 is a cross sectional view showing a diamond film electronic device (thermistor) according to the second example of the present invention.

A pair of electrodes 13 made of, for example, Mo are formed on an insulating substrate 11. Also, a B-doped diamond film 12 is selectively formed on the substrate 11 in a manner as to be slightly extended onto the electrodes 13. Lead wires 15 are then wire bonded to the electrodes 13 at the portions not to be covered with the diamond film 12.

In this example, since an insulating diamond film has not been formed between the B-doped diamond film 12 and the substrate 11, the thermal response characteristic is poorer as compared with Example 1. However, this example is useful to reduce the production cost.

EXAMPLE 3

Figure 7:
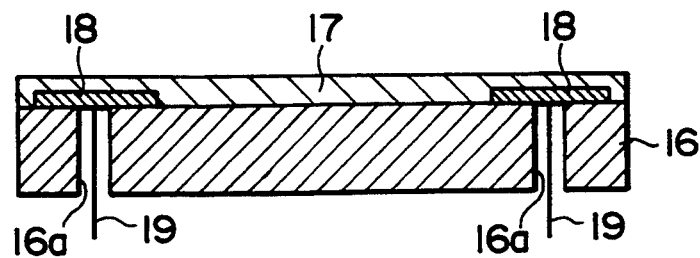
FIG. 7 is a cross sectional view showing a diamond film electronic device according to the third example of the present invention.

FIG. 7 is a cross sectional view showing a diamond film electronic device (thermistor) according to the third example of the present invention.

A pair of electrodes 18 are formed on a substrate 16. Also, a B-doped diamond film 17 is selectively formed on the substrate 16 including the entire region of the electrodes 18. Furthermore, through-holes 16a corresponding to the position of electrodes 18 are provided on the substrate 16. The electrodes 18 are electrically extracted to the opposit side of the substrate 16 by means of lead wires 19 passing through the through-holes 16a.

In this example, the electrodes 18 are not at all exposed on the upper surface side of the device, which makes it easy to embed the thermistor in the wall surface of the container filled with gas or liquid whose temperatures are to be measured or in the wall surface of the isolation wall. In this example, the same effect as in Example 2 is obtained.

EXAMPLE 4

Figure 8:
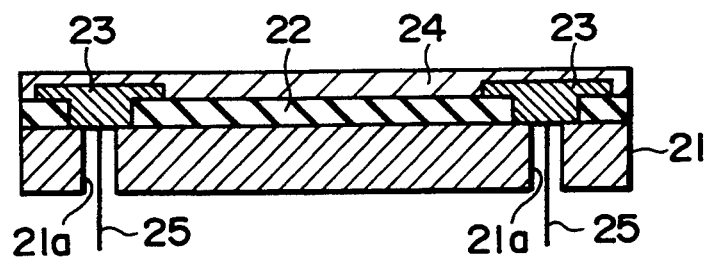
FIG. 8 is a cross sectional view showing a diamond film electronic device according to the fourth example of the present invention.
Figure 9:
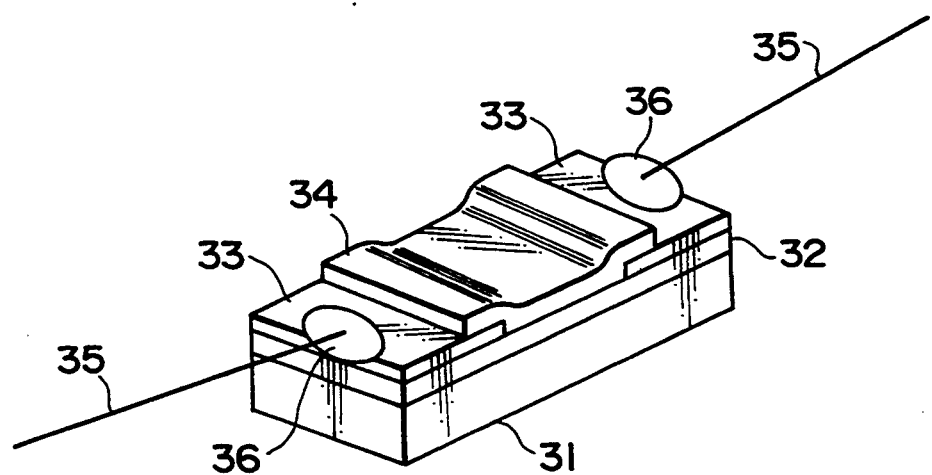
FIG. 9 is a perspective view showing a diamond film thermistor of a prior art.

FIG. 8 is a cross sectional view showing a diamond film electronic device (thermistor) according to the fourth example of the present invention.

This example is similar to Example 3, except that an undoped diamond film 22 is provided between the substrate 21 and the B-doped diamond film 24.

Namely, in this example, an undoped diamond film 22 is formed on the substrate 21. The electrodes 23 are formed in such a manner as to be embedded in an opening portions provided on the undoped diamond film 22 and to be slightly extended onto the undoped diamond film 22. Also, a B-doped diamond film 24 is selectively formed on a region on the undoped diamond film 22 including the region on the electrodes 23. The electrodes 23 are entirely covered with the B-doped diamond film 24.

In this example, just as in Example 3, throughholes 21a corresponding to the electrodes 23 are provided on the substrate 21. The electrodes 23 are electrically connected to the measurement apparatus or the like through lead wires 25 passing through the throughholes 25.

In this exmple, the same effect as Example 3 is obtained. Further, since the B-doped diamond film 24 is formed on the undoped diamond film 22, a good crystallinity of the B-doped diamond film 24 is obtained, and hence an excellent thermal response is also achieved.

In the examples described above, the electrode material comprises Mo; however, it can be other materials such as W, SiC, semiconducting Si (polycrystalline Si), Ti, and their compounds.

As already stated, in order to protect the diamond film devices from very severe environmental conditions, one or multiple protective coating layers, such as $SiO_2$, $Si_3N_4$, BN or diamond, should be deposited on the diamond film.

As described above, according to the present invention, since at least part of each electrode is covered with the B-doped diamond film, the electrode is protected by the B-doped diamond film even in the corrosive atmosphere, thereby making it possible to avoid the deterioration of the electrode. Therefore, diamond film electronic devices with excellent stability against harsh environments are achieved.

Also, according to the present invention, since a plurality of diamond films electronic devices having the above structure can be formed on a single substrate, and then separated from each other by cutting the substrate, it is possible to concurrently form a plurality of diamond film electronic devices with a small variation in the characteristics, and hence to reduce the production cost.

What is claimed is:

1. A diamond film thermistor, comprising:
   a substrate having a substrate upper surface and a substrate lower surface, the substrate upper surface being above the substrate lower surface;
   a metal first electrode on the substrate upper surface having a first electrode lower surface opposing the substrate upper surface and a first electrode upper surface above the first electrode lower surface;
   a metal second electrode on the substrate upper surface having a second electrode lower surface opposing the substrate upper surface and a second electrode upper surface above the second electrode lower surface;
   wherein the first and second electrodes are spaced apart from one another, a first region of the substrate upper surface extending between the first and second electrodes;
   a B-doped diamond film for sensing temperature, extending over the first region of the substrate upper surface, extending over and in contact with a portion of the first electrode upper surface, and extending over and in contact with a portion of the second electrode upper surface;
   at least a first lead wire in contact with the first electrode upper surface in a first contact region;
   at least a second lead wire in contact with the second electrode upper surface in a second contact region;
   a protective container for protecting said first electrode and said second electrode from high temperature environments, wherein said first electrode and said second electrode are encapsulated by the combination of said substrate, said B-doped diamond film, and said protective container, and each point on each surface of said first electrode and said second electrode is in contact with one of said protective container, said boron-doped diamond film, and said substrate, for protecting said first electrode and said second electrode from high temperature environments;
   wherein a region of the B-doped diamond film that is between the first and second electrodes is not covered by said protective container.

2. A thermistor according to claim 1, wherein said substrate comprises an undoped diamond film layer forming the substrate upper surface in the first region and below and in contact with the B-doped diamond film in a region that is between the first and second electrodes.

3. A thermistor according to claim 1, wherein the first and second electrodes each comprise a member selected from the group consisting of molybdenum, tungsten, silicon carbide, silicon, and titanium.

4. A thermistor according to claim 3, wherein the first and second electrodes comprise molybdenum.

5. A thermistor according to claim 1, further comprising a protective coating layer disposed on top of and in contact with the B-doped diamond layer.

6. A thermistor according to claim 5, wherein said protective coating layer comprises a member selected from the group consisting of silicon dioxide, silicon nitride, boron nitride, and diamond.

7. A diamond film thermistor, comprising:
- a substrate having a substrate upper surface and a substrate lower surface, the substrate upper surface being above the substrate lower surface;
- a metal first electrode on the substrate upper surface having a first electrode lower surface opposing the substrate upper surface and a first electrode upper surface above the first electrode lower surface;
- a metal second electrode on the substrate upper surface having a second electrode lower surface opposing the substrate upper surface and a second electrode upper surface above the second electrode lower surface;
- wherein the first and second electrodes are spaced apart from one another, a first region of the substrate upper surface extending between the first and second electrodes;
- a B-doped diamond film for sensing temperature, extending over the first region of the substrate upper surface, extending over and in contact with a portion of the first electrode upper surface, and extending over and in contact with a portion of the second electrode upper surface;
- wherein the substrate has a first passage extending from the substrate lower surface to the substrate upper surface, thereby exposing a region of the first electrode lower surface that is beneath the portion of the first electrode upper surface that is in contact with the B-doped diamond film, the substrate has a second passage extending from the substrate lower surface to the substrate upper surface, thereby exposing a region of the second electrode lower surface that is beneath the portion of the second electrode upper surface that is in contact with the B-doped diamond film;
- first and second lead wires that electrically connect through the first and second passages, respectively, to the lower surfaces of the first and second electrodes, respectively; and
- a protective container for protecting said first electrode and said second electrode from high temperature environments, wherein said first electrode and said second electrode are encapsulated by the combination of said substrate, said B-doped diamond film, said protective container, and said first and second lead wires, and each point on each surface of said first electrode and said second electrode is in contact with one of said protective container, said B-doped diamond film, said substrate, and said first and second lead wires, for protecting said first electrode and said second electrode from high temperature environments.

8. A thermistor according to claim 7, wherein said substrate comprises a layer of undoped diamond that forms the first region of the substrate upper surface and that is beneath and in contact with a region of the B-doped diamond layer that is between the first and second electrodes.

9. A thermistor according to claim 7, wherein the first and second electrodes comprise a material selected from the group consisting of molybdenum, tungsten, silicon carbide, silicon, and titanium.

10. A device according to claim 9, wherein the first and second electrodes comprise molybdenum.

11. A thermistor according to claim 7, further comprising a protective coating layer disposed on top of and in contact with the B-doped diamond layer.

12. A thermistor according to claim 11, wherein said protective coating layer comprises a member of the group consisting of silicon dioxide, silicon nitride, boron nitride, and diamond.

13. A diamond film thermistor, comprising:
- a substrate having a substrate upper surface and a substrate lower surface, the substrate upper surface being above the substrate lower surface;
- a metal first electrode on the substrate upper surface having a first electrode lower surface opposing the substrate upper surface and a first electrode upper surface above the first electrode lower surface;
- a metal second electrode on the substrate upper surface having a second electrode lower surface opposing the substrate upper surface and a second electrode upper surface above the second electrode lower surface;
- wherein the first and second electrodes are spaced apart from one another, a first region of the substrate upper surface extending between the first and second electrodes;
- a B-doped diamond film for sensing temperature, extending over the first region of the substrate upper surface, extending over, covering, and in contact with a B-doped covered portion of the first electrode upper surface, and extending over, covering, and in contact with a B-doped covered portion of the second electrode upper surface;
- wherein the first electrode upper surface consists of two regions, its B-doped diamond film covered region and a region that is not covered by said B-doped diamond film, the second electrode upper surface consists of two regions, its B-doped diamond film covered region and a region that is not covered by said B-doped diamond film;
- at least a first lead wire in contact with the region of the first electrode upper surface that is not covered by said B-doped diamond film;
- at least a second lead wire in contact with the region of the second electrode upper surface that is not covered by the B-doped diamond film;
- a protective container for protecting said first electrode and said second electrode from high temperature environments, wherein said first electrode and said second electrode are encapsulated by the combination of said substrate, said B-doped diamond film, and said protective container, and each point on each surface of said first electrode and said second electrode is in contact with one of said protective container, said B-doped diamond film, said substrate, and said at least said first lead wire, and said at least said second lead wire, for protecting said first electrode and said second electrode from high temperature environments;
- wherein a region on the B-doped diamond film that is between the first and second electrodes is not covered by said protective container.

14. A thermistor according to claim 13, wherein the first and second electrodes each comprise a member selected from the group consisting of molybdenum, tungsten, silicon carbide, silicon, and titanium.

15. A thermistor according to claim 14, wherein the first and second electrodes comprise molybdenum.

16. A thermistor according to claim 13, further comprising a protective coating layer disposed on top of and in contact with the B-doped diamond layer.

17. A thermistor according to claim 16, wherein said protective coating layer comprises a member selected from the group consisting of silicon dioxide, silicon nitride, boron nitride, and diamond.

18. A thermistor according to claim 1, wherein a region of said boron-doped diamond film is not covered by said protective container.

19. A thermistor according to claim 1, further comprising a protective coating layer disposed on top of and in contact with the B-doped diamond layer, wherein said protective coating layer comprises a member of the group consisting of silicon dioxide, silicon nitride, boron nitride, and diamond.

* * * * *